(12) United States Patent  (10) Patent No.: US 8,064,239 B2
Ertosun et al.  (45) Date of Patent: Nov. 22, 2011

(54) MEMORY CIRCUIT WITH QUANTUM WELL-TYPE CARRIER STORAGE

(75) Inventors: Mehmet Günhan Ertosun, Stanford, CA (US); Krishna Chandra Saraswat, Saratoga, CA (US); Pawan Kapur, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 59 days.

(21) Appl. No.: 12/617,352

(22) Filed: Nov. 12, 2009

(65) Prior Publication Data

US 2010/0149864 A1 Jun. 17, 2010

Related U.S. Application Data

(60) Provisional application No. 61/113,634, filed on Nov. 12, 2008.

(51) Int. Cl.
*G11C 17/00* (2006.01)
(52) U.S. Cl. .......... 365/104; 365/103; 365/114; 365/72; 365/27

(58) Field of Classification Search .................. 365/104, 365/103, 114, 72, 27
See application file for complete search history.

(56) References Cited

U.S. PATENT DOCUMENTS 7,047,391 B2    5/2006  Dally et al.
7,216,214 B2    5/2007  Dally et al.
2008/0316828 A1*  12/2008  Hanafi et al. ............. 365/185.17

OTHER PUBLICATIONS

Erotsun, M. Gunhan;, Kapur, Pawan; Saraswat, Krishna C., "A Highly Scalable Capacitorless Double Gate Quantum Well Single Transistor DRAM: 1T-QW DRAM," IEEE Device Letters, 2008.

* cited by examiner

*Primary Examiner* — Thong Q Le
(74) *Attorney, Agent, or Firm* — Crawford Maunu PLLC

(57) ABSTRACT

Data is stored in a quantum-well type structure with double gate control. According to an example embodiment, a transistor-based data storage circuit includes a gate, a back gate and a semiconductor channel between the gate and the back gate. Carriers are stored in a storage pocket structure in the channel, in response to biases applied to the gate and back gate. Current passing through the channel is sensed and used to detect the stored carriers and, correspondingly, a memory state of the storage circuit.

22 Claims, 5 Drawing Sheets

US 8,064,239 B2

MEMORY CIRCUIT WITH QUANTUM WELL-TYPE CARRIER STORAGE

RELATED PATENT DOCUMENTS

This patent document claims the benefit, under 35 U.S.C. §119(e), of U.S. Provisional Patent Application Ser. No. 61/113,634 filed on Nov. 12, 2008, and entitled "Memory Circuit With Quantum Well-Type Carrier Storage," including the Appendix filed therewith and forming part of the Provisional Patent Application, which is fully incorporated herein by reference.

FIELD

The present invention relates generally to electronic circuits, and more specifically, to transistor-based memory circuits.

BACKGROUND

The storage of data is important for a variety of reasons. However, such storage can be challenging to implement for certain applications, and can be susceptible to undesirably slow operation. Undesirable characteristics may include, for example, difficulties relating to manufacturing, data retention, width descretization, body impurities, junction leakage field lines and others.

These and other issues remain as a challenge to a variety of methods, devices and systems that use or benefit from memory circuits.

SUMMARY

Various aspects of the present invention are directed to devices, methods and systems involving memory circuits that address challenges including those discussed above.

According to an example embodiment, a transistor-based data storage circuit includes a gate, a back gate, and a semiconductor channel between the gate and the back gate and having a storage pocket structure therein. The storage pocket structure is configured to store carriers for storing data in response to a bias applied to the gate and a bias applied to the back gate, and to pass current for sensing to detect a memory state of the storage circuit that is responsive to the stored carriers.

Another example embodiment is directed to a capacitorless transistor memory circuit, including a gate, back gate, source, drain and a semiconductor channel between the source and drain. The channel is separated from the gate and back gate respectively by a gate insulator material and a back gate insulator material. The channel includes, at a region separated from and between each of the gate and back gate, a quantum well-type region to store carriers in response to a bias applied to the gate and another bias applied to the back gate. A logic state of the circuit arrangement is defined as a function of conductivity of the channel between the source and drain as set by the stored carriers.

Another example embodiment is directed to a method for storing, reading and erasing data from a transistor-based data storage circuit. The data is stored as carriers in a storage pocket structure of a semiconductor channel between a gate and a back gate. A front bias is applied to the gate and a back bias is applied to the back gate to store carriers in the storage pocket structure and set a logic state of the data storage circuit. Current passing through the channel is sensed to detect the set logic state of the data storage circuit. Appropriate erasing biases are applied to the appropriate terminals (e.g., source, drain, gate and/or back gate) to purge carriers from the storage pocket structure. For example, a negative bias can be applied to the drain, alone or in combination with the application of a positive back-gate-erasing bias to the back gate to purge carriers from the storage pocket structure. Such a back-gate-erasing bias is opposite in sign, relative to the back bias (e.g., where the back bias is applied via a voltage that is less than zero, the back-gate-erasing bias is applied using a voltage that is greater than zero volts)."

Various other aspects of the invention are directed to embodiments described and/or shown in the above-referenced Provisional Patent Application and the Appendix forming part of that application as well as references cited therein, or as implemented in connection with one or more other embodiments described, shown or claimed herein.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
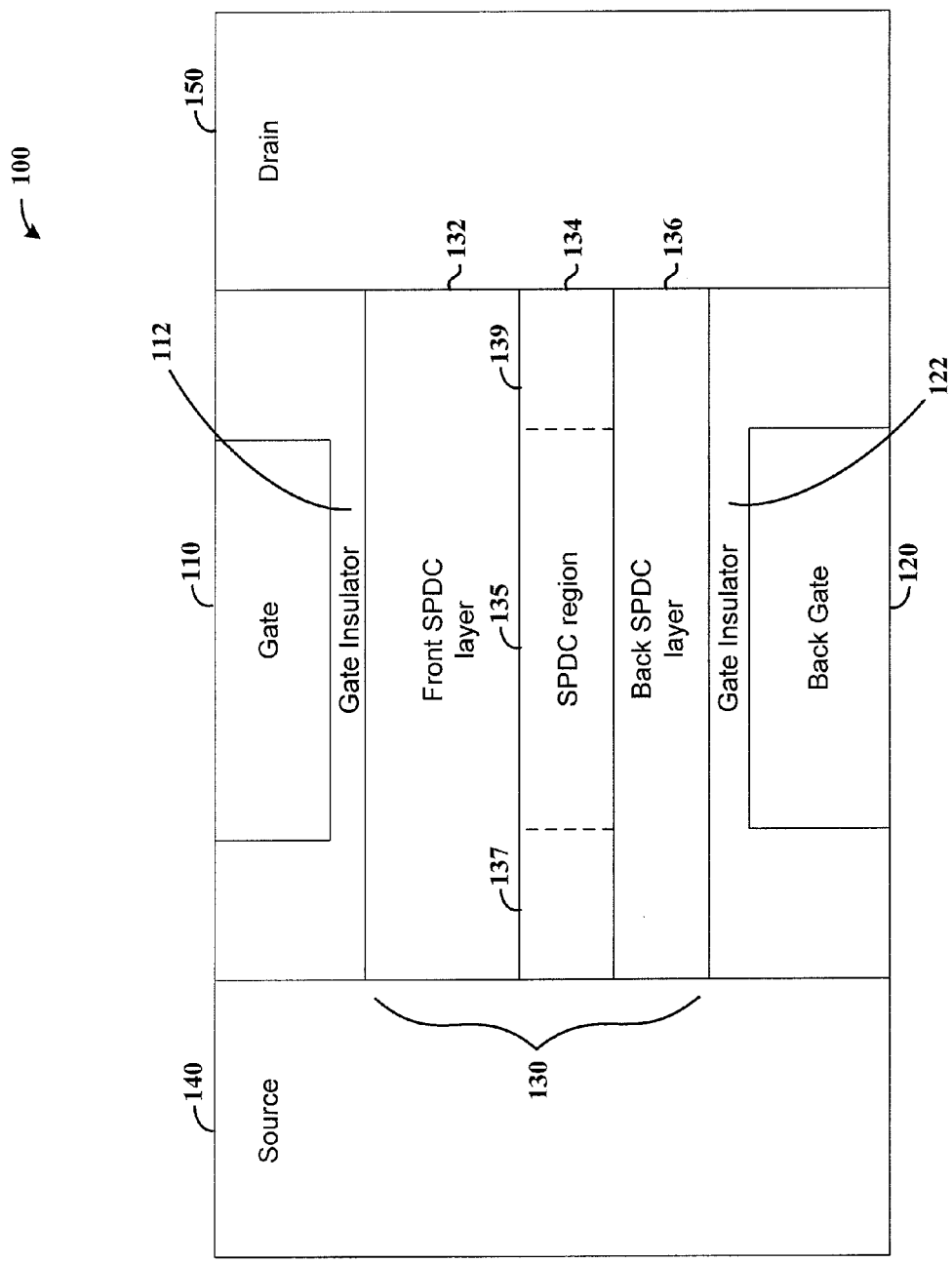
FIG. 1 shows a transistor-based data storage circuit, according to another example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to devices, methods and systems involving memory transistors, circuits, circuit arrangements, memory arrays, related controllers and methods of operation as described herein. While the present invention is not necessarily limited to such approaches, various aspects of the invention may be appreciated through a discussion of examples using these and other contexts.

According to an example embodiment, a semiconductor memory circuit includes a gate, a back gate and a channel region between the gates, the channel region having a storage pocket (e.g., a quantum well-type structure having a quantum well or well-like band bending structure) that stores carriers such as electrons or holes. The gate and back gate operate to control the storage of carriers to set a logic state of the memory circuit, with current flow via the channel being sensed to provide an indication of the logic state.

The channel region includes one or more of a variety of materials. In some applications, the channel region includes silicon material that is adjacent to both gates, with a quantum well-type material as an island or layer that is separated from each gate by the silicon material. The quantum well-type material may include, for example, a silicon germanium material or a material including other semiconductors such as a type III-V semiconductor. Other implementations involve channel arrangements of semiconductor material doped to effect a quantum well-type structure or island within the channel.

In some embodiments, the memory circuit is configured to exhibit a controllable spatial hole distribution, such as to meet a design specification, within the body of the device such as at a location that is close to the front gate of a double gate device or other position as desirable for a particular application. This spatial hole distribution may, for example, be set via operation of the memory circuit as a capacitorless, one-transistor dynamic random-access memory (1T-DRAM) circuit on as Silicon-type wafer, with a quantum well-type structure that sets the spatial hole distribution. In some implementations, the spatial hole distribution is controlled in the storage pocket, by selectively biasing the gate and reverse biasing the back gate, as well as by setting the position of the storage pocket (e.g., well-type structure or bending structure).

In connection with various embodiments discussed herein, and as applicable to the above-discussed memory circuit, a bending structure or band-bending structure as discussed generally refers to a structure that exhibits a local change in energy of electrons at a semiconductor junction due to space charge effects. In this regard and in connection with related embodiments, a storage pocket, node or related circuit as described herein includes such a structure exhibiting a local change in electron energy at a semiconductor junction, due to space charge effects.

The following discussion makes reference to certain references as cited in connection with the underlying provisional patent application and the Appendix forming part of the provisional application, which are fully incorporated herein by reference.

In some applications, a front MOS structure having a front gate (G1, for short) is used as a switching transistor, and a back gate MOS structure (G2, for short) is used to create a floating body storage node. The back gate is reverse biased to keep the excess holes (or, e.g., electrons) in the body and to obtain a memory operation that is amenable to use with devices including highly-scaled fully-depleted devices. Some applications involve the indicated structure located in a horizontal arrangement, and others involve the structure as shown in a vertical arrangement. Certain applications also involve using channel components with a relatively low body impurity concentration, and exhibiting a relatively low junction leakage current and desirable retention time. The double-gate structure (front and back gates) can be implemented in a manner that terminates field lines from the drain, facilitating the use of a relatively thick gate oxide (e.g., as compared to bulk logic MOS transistors), which increases the body coefficient (see, e.g., Ertosun, M. Giinhan; Cho H.; Kapur, P.; Saraswat, K. C., "A Nanoscale Vertical Double-Gate Single-Transistor Capacitorless DRAM," Electron Device Letters, IEEE, Vol. 29, No. 6, pp. 615-617, June 2008). Certain applications involve such a double-gate memory circuit (e.g., DRAM) be fabricated with a cell size of about $4F^2$ (see, e.g., T. Tanaka, E. Yoshida, T. Miyashita, "Scalability study on a capacitorless 1T-DRAM: from single-gate PD-SOI to double-gate FinDRAM," Electron Devices Meeting, 2004. IEDM Technical Digest. IEEE International, pp. 919-922, 13-15 Dec. 2004).

In some implementations, a fully depleted silicon-on-insulator MOSFET device has a body thickness of $T_{si}$ and a gate oxide of $T_{ox}$, the body coefficient is defined as $$dV_t/dV_{BS}=-3T_{ox}/T_{si},$$

where $V_t$ is the threshold voltage and $V_{BS}$ is the back gate bias. Certain implementations further involve doping the body and correspondingly setting parameters such as drain current differential. As consistent with various embodiments discussed herein, the MOSFET device includes relatively thinner $T_{si}$ and thicker $T_{ox}$, to exhibit a substantial $V_t$ change via relatively small body potential changes. Certain implementations are directed to a double-gate DRAM device having a FINFET device (e.g., a double-gate wrapped around a channel region), and other implementations are directed to an independently-controlled double-gate floating body cell on a silicon-on-insulator structure. As with other embodiments, these devices can be fabricated on a bulk silicon wafer, facilitating desirable cost and process integration characteristics.

In some instances, the body thickness $T_{si}$ is set to about 80 nm and the back gate voltage is controlled at about −1.8V. The difference in drain current ($I_d$) is highly correlated with retention, and the threshold voltage ($V_t$) shift value captures the effect of the presence of the holes on the $V_t$. This difference in current is set in a range that can be sensed by sense amplifiers to determine the state of memory.

In some embodiments, the distribution of stored holes is moved closer to the front gate, using one or more of positioning of a quantum well-type region, gates, oxides and/or operation of the gate and back gate in combination. This approach can be used to shift the threshold voltage ($V_t$), and may be implemented to maintain a high retention time. Some embodiments are directed to a horizontal double gate structure applied as discussed, for example, in J. Gautier, K. A. Jenkins, J.Y.-C. Sun, "Body charge related transient effects in floating body SOI NMOSFETs," Electron Devices Meeting, 1995, International, pp. 623-626, 10-13 Dec. 1995. Other embodiments are directed to a vertical double gate structure as described in the Ertosun reference cited above, or as a FINFET device using a vertical epitaxy approach.

Referring to the figures, FIG. 1 shows a transistor-based data storage circuit 100, according to another example embodiment of the present invention. The circuit 100 includes a gate 110, a back gate 120 and a semiconductor channel 130 between the gate and the back gate and separating a source 140 and drain 150. Each of the gate 110 and back gate 120 are respectively separated from the channel 130 by gate insulator material 112 and 122, such as a gate oxide.

The semiconductor channel 130 includes a carrier storage pocket and distribution control (SPDC) region at 134, which is between front and back SPDC layers 132 and 136, respectively. The SPDC region may extend as a layer between the source 140 and drain 150 as shown by layer 134, or may be relatively isolated as an island-type structure 135, bounded by dashed lines as shown (and, e.g., with material at ends 137 and 139 that matches one or both of the front and back SPDC layers). Each of the layers 132, 134 and 136 may include different structures or layers within, such as alternating dielectric and semiconducting layers (e.g., in the front and back SPDC layers). The SPDC region may also include multiple island-type structures in the channel 130 generally and/or within region 135. The SPDC region at 134 stores carriers for storing data in response to a bias applied to the gate 110 and a bias appropriate to the back gate 120 (e.g., a bias different from that applied to the gate 110, such as a reverse or other bias). In some instances, the biases are respectively applied in different manners and at different times, such as by applying a reverse bias to the back gate during programming and hold states, and applying a different bias during other states. Current sensed via the source 140 and drain 150 provides an indication of the stored carriers and, correspondingly, a logic state of the circuit 100.

Figure 2:
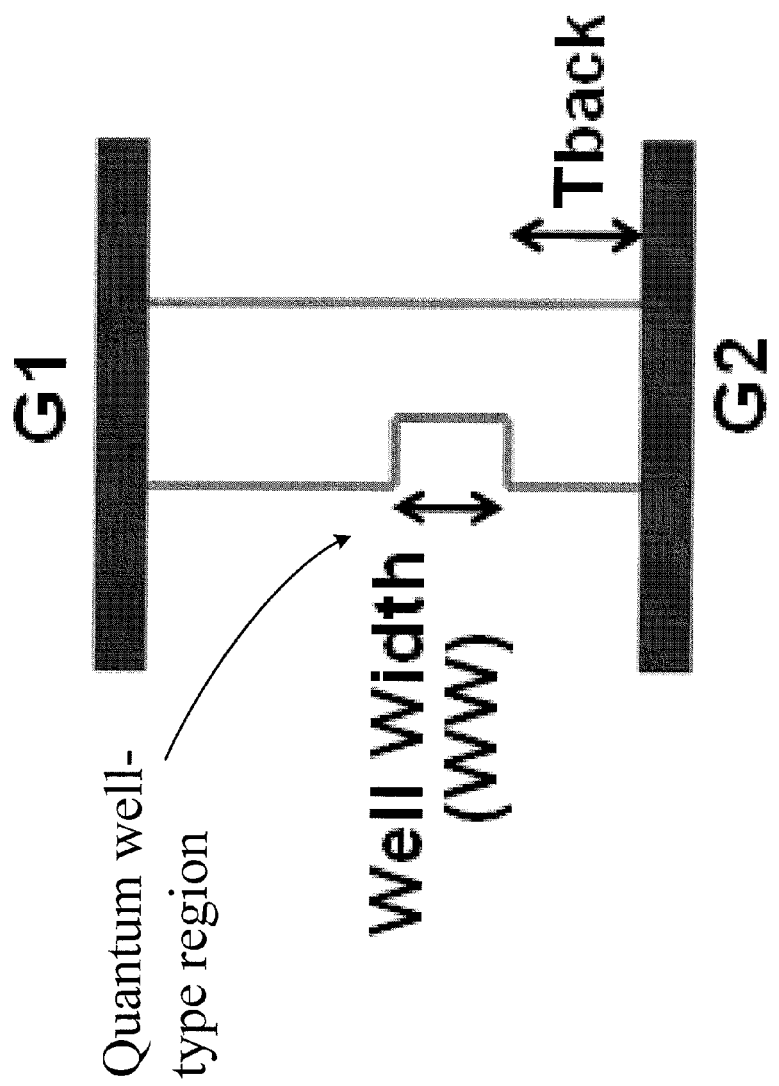
FIG. 2 shows a schematic of a band diagram of a double gate heterostructure capacitorless memory circuit, in accordance with one or more example embodiments.

FIG. 2 shows a schematic of a band diagram of a double gate heterostructure capacitorless memory circuit, illustrating a quantum well-type region in the body of the device in accordance with one or more example embodiments. This circuit can be implemented using, for example, Si and Ge (or SiGe) in the quantum well-type region, or using another type semiconductor system in the quantum well-type region (and/or in adjacent channel regions). The size and arrangement of the quantum well-type region vary depending upon the application, and can be implemented at a width of about 5 nm. The following table shows example operating voltages for the heterostructure represented in FIG. 2, the circuit in FIG. 1, and/or otherwise described herein or shown in the figures.

TABLE 1

|  | Program (Write "1") | Erase (Write "0") | Read | Hold |
| --- | --- | --- | --- | --- |
| Gate 1 Voltage (V) | 1 | 1.5 | 0.8 | 0 |
| Drain Voltage (V) | 1.2 | −1.5 | 0.2 | 0 |
| Gate 2 Voltage (V) | −1.5 | −1.5 | −1.5 | −1.5 |

Figure 5:
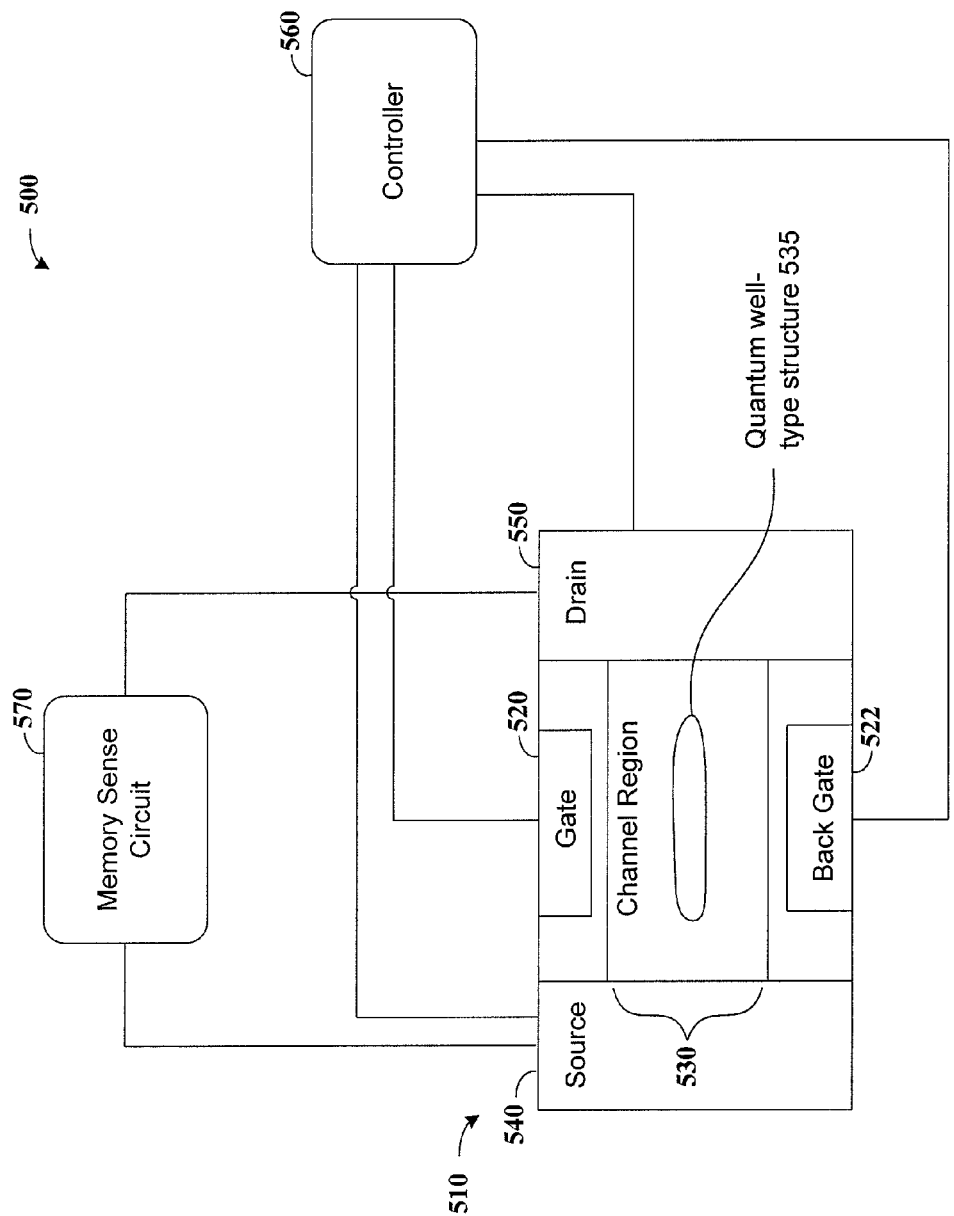
FIG. 5 shows a memory circuit arrangement, according to another example embodiment of the present invention.

The following discussion is directed to an example operation of a double-gate memory circuit in accordance with one or more example embodiments, and may be applicable for use with circuits shown in the figures such as those in FIG. 1 and in FIG. 5, discussed herein. However, it is to be understood that these operational aspects are exemplary, with other approaches amenable to implementation in accordance with these or other example embodiments.

Program:

In some embodiments, program operations are carried out using a mechanism of impact ionization that occurs at the drain side. The device body can be saturated with holes in a few nanoseconds. In other embodiments, program operations are carried out using gate-induced drain leakage (GIDL). Still other embodiments involve erasing approaches as well.

Hold:

The retention time is set according to how long carriers (e.g., holes) generated by impact ionization can be kept in the floating body. An appropriate bias (e.g., a negative bias) is applied to the back gate to keep the holes in a created floating body storage node.

In some embodiments, the bias applied to the back gate is done to mitigate charge loss through leakage by effecting a relatively low vertical electric field (with an orientation involving a front gate on top and a back gate on bottom of a memory circuit). This mitigation is furthered, in many embodiments, by setting a relatively thick gate oxide and relatively thin body (channel), in connection with the double-gate bias-controlled electric junctions. These approaches are also amenable to effecting reduced band-to-band tunneling and, with a relatively thin silicon body, drain-induced barrier lowering.

Read:

Reading is done by switching on the front (e.g., MOS) structure without disturbing the memory state stored, sensing the current and determining the state by the current difference (i.e., $V_t$ shift). In the programmed '1' state, cells have excess holes. Therefore, due to increased body potential, the cells have higher drain current because of the body effect. A sense amplifier is used to sense the current difference between two states of '1' and '0' and hence the state of the device. For general information regarding memory circuits, and for specific information regarding circuits and/or approaches that may be implemented in connection with one or more example embodiments, reference may be made to T. Ohsawa, K. Fujita, T. Higashi, Y. Iwata, T. Kajiyama, Y. Asao, and K. Sunouchi, "Memory design using one-transistor gain cell on SOI," in Proc. ISSCC, pp. 152-153, 2002.

Erase:

Erasing is done in one or more of a variety of manners. One or more terminals such as the back gate, front gate, drain and source can be used to effect erasing. In some applications, the back gate is switched to a voltage or bias that facilitates the purging of carriers from a storage pocket. In one instance, the front gate is biased with a positive voltage and the back gate is switched from a reverse (negative) bias to a positive bias to push holes away from the storage pocket.

In some implementations, example operating voltages for executing an erase step (e.g., for the heterostructure represented in FIG. 2, the circuit in FIG. 1, and/or otherwise described herein or shown in the figures) is carried out in accordance with Table 2 below.

TABLE 2

|  | Program (Write "1") | Erase (Write "0") | Read | Hold |
| --- | --- | --- | --- | --- |
| Gate 1 Voltage (V) | 1 | 1.5 | 0.8 | 0 |
| Drain Voltage (V) | 1.2 | −1.5 | 0.2 | 0 |
| Gate 2 Voltage (V) | −1.5 | 1.5 | −1.5 | −1.5 |

To carry out an erase step in accordance with Table 2, the back gate voltage is switched to a positive value during erase to push holes away effectively. The specific operating voltages shown in Table 2 are exemplary. This approach facilitates desirable erase performance and related speed, and further facilitates the control of the spatial distribution of the holes within the device body.

Figure 3:
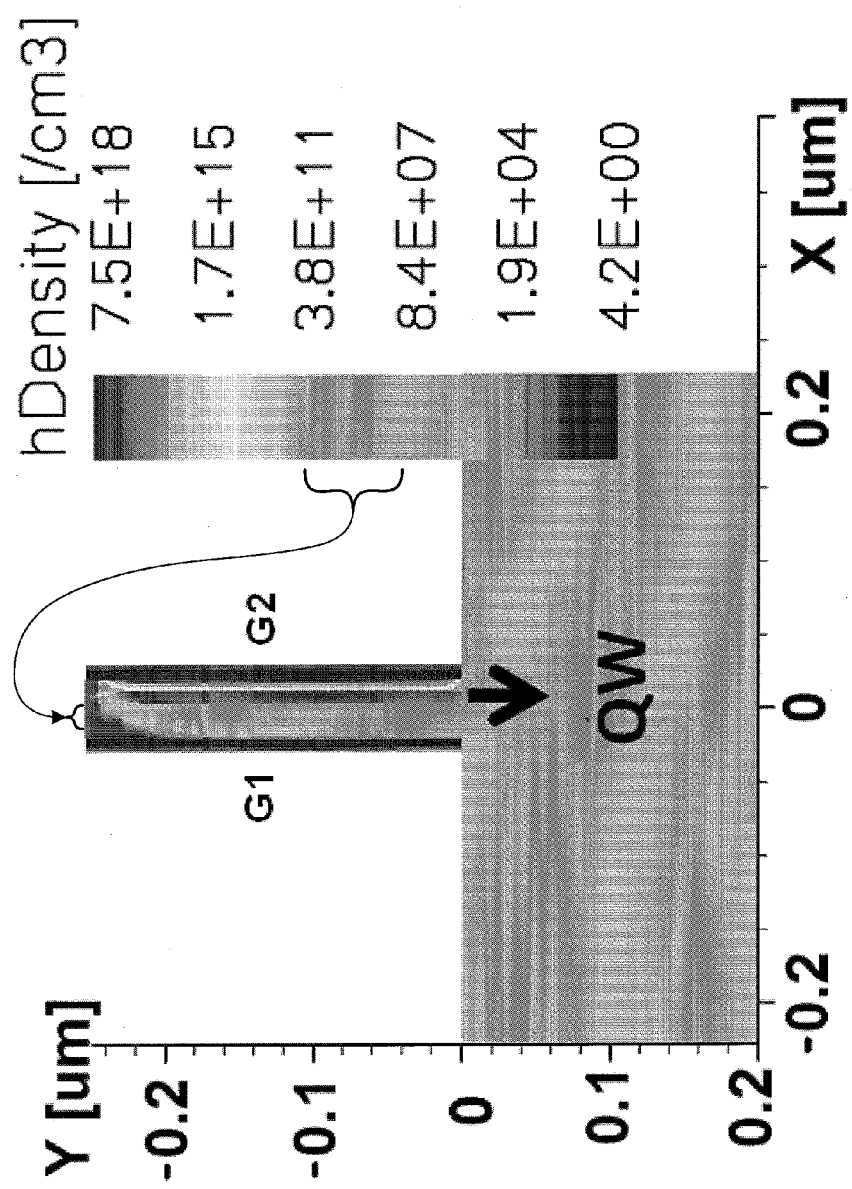
FIG. 3 shows example operational characteristics of a double-gate transistor circuit having a quantum well-type structure close to a back gate interface, according to another example embodiment of the present invention.

FIG. 3 shows example operational characteristics of a double-gate transistor circuit having a quantum well-type structure close to a back gate interface (e.g., about 10 nm away from the back gate interface (i.e., $T_{back}$=10 nm for FIG. 2)), according to another example embodiment of the present invention. The gates are respectively represented as the front gate G1 and back gate G2. The hole distribution is shifted towards the front gate with the incorporation of a quantum well-type structure.

Figure 4:
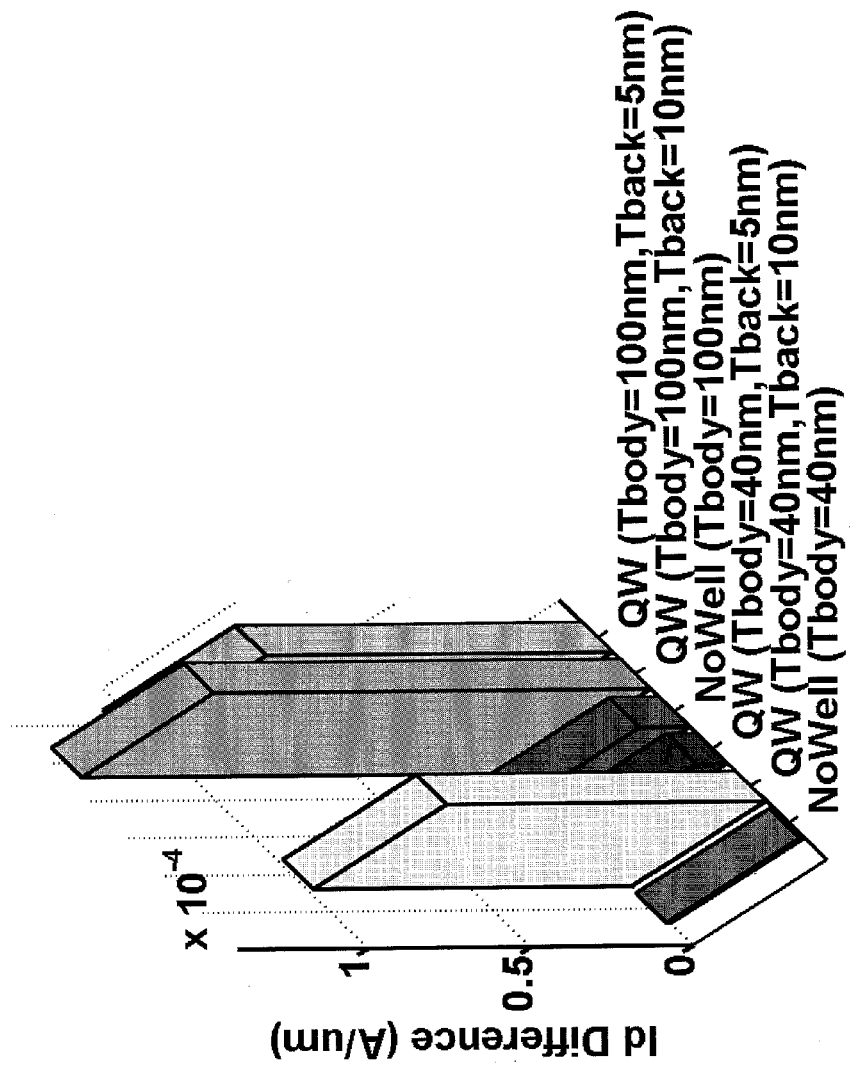
FIG. 4 shows example comparisons of drain current ($I_d$) for different structures in accordance with various example embodiments.

FIG. 4 shows example comparisons of drain current ($I_d$) for different structures, which can accordingly be used to set a logic condition for a memory circuit, in accordance with various example embodiments. The shown examples represent drain current differences between R1 and R2 (e.g., respectively the read of programmed and erased states) of devices with a quantum well in their body and with the devices with no quantum well for $T_{body}$={100 nm, 40 nm} and $T_{back}${5 nm, 10 nm}, with a well width (WW) of about 5 nm. The comparisons involve devices with a quantum well-type structure (QW) at different spacing relative to a back gate interface, and with certain devices not having such a quantum well-type structure. When $T_{back}$ is increased from 5 nm to 10 nm, operational characteristics (compared to the device without quantum well) in the 100 nm body thickness device increases from 7× to 9×, and in the 40 nm body thickness device it increases from 8× to 86×.

Various embodiments are directed to engineering the spatial distribution of holes (or electrons) using such an approach as shown in FIG. 4 for designing a memory circuit. In some applications, a difference in $I_d$ is set at subsequent reads R1 and R2 to not only capture information related to the $V_t$ shift, but also to maintain a higher retention (since the reads are done after some time passes after programming and erasing). This value is highly correlated with retention, whereas the $V_t$ shift value captures the effect of the presence of the holes on the $V_t$, but not how long that change could be maintained. Also, this difference in the current is set in the range, which can be sensed by sense amplifiers so as to determine the state of the memory circuit. The introduction of such a "storage pocket" for holes and the engineering of the spatial distribution of holes can be implemented to provide desirable performance.

Other applications are directed to arranging a quantum well-type structure and controlling the memory circuit to keep stored holes away from the back oxide interface of a back gate (e.g., as in FIG. 1) to avoid traps and dangling bonds, and to further desirably affect extrinsic retention. This approach can be implemented, for example, with materials such as Ge and III-V materials, and those where passivation of interface traps is problematic.

FIG. 5 shows a memory circuit arrangement 500, according to another example embodiment of the present invention. The arrangement 500 includes a double gate, quantum well-type memory cell 510, a controller 560 to control the storage of data in the cell, and a memory sense circuit 570 to sense current in the cell for detecting a logic state thereof.

The quantum well-type memory cell 510 includes a gate 520 and back gate 522 separated by a channel region 530, which also separates a source 540 and drain 550. The channel region 530 includes a quantum well-type structure 535 that is arranged in composition and position, with the gate 520 and back gate 522, to store carriers and effect a current characteristic of the cell 510 for storing a logic state. The controller 560 is programmed to apply an appropriate bias to one or more of the gate 520, back gate 522 (e.g., a reverse bias), source 540 and drain 550 for controlling the collection of carriers in the quantum well-type structure 535, to correspondingly control current passing characteristics of the channel region 530.

The devices herein, such as those shown in FIG. 1 and in FIG. 5, can be implemented with a multitude of different types of memory arrays. For instance, a controller as shown in FIG. 5 may be implemented to control a multitude of memory cells 510, which can be arranged in rows and columns (or another arrangement), with current sensed therein by a sense circuit 570 coupled to the cells (where appropriate, via rows and columns). As example memory array applications to which one or more embodiments described herein may be applied, reference may be made to U.S. Pat. Nos. 7,216,214 and 7,047,391, which are fully incorporated herein by reference.

Various embodiments described above, in the Figures and in the above-referenced provisional patent application (including its Appendix and the references cited therein) that forms part of this patent document may be implemented together and/or in other manners. One or more of the elements depicted in the drawings/figures can also be implemented in a more separated or integrated manner, or removed and/or rendered as inoperable in certain cases, as is useful in accordance with particular applications. It is also within the spirit and scope to implement a program or code that can be stored in a machine-readable medium to permit a computer to perform one or more aspects of the approaches described above, such as those involving the storage and retrieval of data. In addition, various example embodiments involve one or more approaches as described in the provisional patent application referenced above, including the references cited therein, alone and/or in connection with one or more embodiments as described herein. In view of the description herein, those skilled in the art will recognize that many changes may be made thereto without departing from the spirit and scope of the present invention.

What is claimed is:

1. A transistor-based data storage circuit comprising:
   a gate;
   a back gate; and
   a semiconductor channel between the gate and the back gate and having a storage pocket structure that is configured to store carriers for storing data in response to a bias applied to the gate and another bias applied to the back gate, and to pass current for detecting a memory state of the storage circuit that is responsive to the stored carriers.

2. The circuit of claim 1, further including
   a gate insulator material between the gate and the semiconductor channel, and
   another gate insulator material between the back gate and the semiconductor channel.

3. The circuit of claim 1, further including
   a gate insulator material between and in contact with both the gate and the semiconductor channel, and
   another gate insulator material between and in contact with both the back gate and the semiconductor channel,
   wherein the gate, back gate, semiconductor channel and gate insulator materials form a capacitorless memory structure.

4. The circuit of claim 1, wherein the storage pocket structure is configured to store carriers for storing data in response to a bias applied to the gate and a reverse bias applied to the back gate.

5. The circuit of claim 1, wherein the storage pocket structure is configured to store carriers for storing data in response to a bias applied to the gate and a bias applied to the back gate.

6. A transistor-based data storage comprising:
   a gate;
   a back gate; and
   a semiconductor channel between the gate and the back gate and having
      a carrier storage pocket and distribution control (SPDC) region configured to store carriers for storing data in response to a bias applied to the gate and another bias applied to the back gate, and to pass current for detecting a memory state of the storage circuit that is responsive to the stored carriers,
      a front-side SPDC layer between the SPDC region and the gate, and
      a back-side SPDC layer between the SPDC region and the back gate.

7. The circuit of claim 6, wherein the semiconductor channel includes a type III-V semiconductor material.

8. The circuit of claim 6, wherein the
   (SPDC) region includes at least one of silicon-germanium and pure germanium, the front-side SPDC layer includes a silicon layer, and the back-side SPDC layer includes a silicon layer.

9. The circuit of claim 6, wherein the
   front-side SPDC layer includes a semiconductor layer and a dielectric layer, between the SPDC region and the gate, and the back-side SPDC layer includes a semiconductor layer and a dielectric layer, between the SPDC region and the back gate.

10. A transistor-based data storage circuit, comprising:
a gate;
a back gate; and
a semiconductor channel between the gate and the back gate and having a quantum well-type storage pocket structure that is configured to store carriers for storing data in response to a bias applied to the gate and another bias applied to the back gate, and to pass current for detecting a memory state of the storage circuit that is responsive to the stored carriers.

11. The circuit of claim 10, wherein the storage pocket structure is a semiconductor structure having a quantum well-type band bending alignment.

12. The circuit of claim 10, wherein the semiconductor channel is configured to store carriers that include at least one of holes and electrons.

13. The circuit of claim 10, wherein the storage pocket structure includes layers of dielectric and semiconductor materials, and includes a bending structure that exhibits a local change in electron energy at a semiconductor junction, due to space charge effects.

14. A capacitorless transistor memory circuit arrangement comprising:
a gate;
a back gate;
a gate insulator material in contact with the gate;
a back gate insulator material in contact with the back gate;
a source;
a drain; and
a semiconductor channel between the gate insulator material and the back gate insulator material, the channel including, at a region separated from and between each of the gate and back gate, a quantum well-type region that is configured and arranged to store carriers in response to a bias applied to the gate and another bias applied to the back gate;
wherein the semiconductor channel exhibits a detectable logic state that is defined as a function of conductivity of the channel between the source and drain as set by the stored carriers.

15. The capacitorless transistor memory circuit arrangement of claim 14, further including
a logic circuit connected to sense current flowing between the drain and source and, in response thereto, to detect the logic state upon the sensed amount of current.

16. The capacitorless transistor memory circuit arrangement of claim 14, further including
a control circuit to apply the bias to the gate and at least one of the back gate, source and drain to control the storage of carriers in the quantum well-type region to set the logic state.

17. The capacitorless transistor memory circuit arrangement of claim 14, further including a logic circuit connected to sense current flowing between the drain and source and, in response thereto, to detect the logic state of the semiconductor channel based upon the sensed amount of current, and
a control circuit to apply the bias to the gate and to apply the bias to the back gate, to control the storage of carriers in the quantum well-type region to set the logic state.

18. The capacitorless transistor memory circuit arrangement of claim 14, further including a control circuit to
apply the biases to the gate and the back gate to store carriers in the quantum well-type region and set the logic state, and
after storing carriers in the quantum well-type region, applying a different bias to the back gate that is different than the bias applied to the back gate for storing carriers, to purge the stored carriers from the quantum well-type region.

19. A method for storing, reading and erasing data from a transistor-based data storage circuit having a gate, a back gate and a semiconductor channel between the gate and the back gate, the semiconductor channel having a storage pocket structure that is configured to store carriers indicative of a memory state of the transistor-based data storage circuit, the method comprising:
applying a front bias to the gate and applying back bias to the back gate to store carriers in the storage pocket structure to set the memory state of the transistor-based data storage circuit;
sensing current passing through the semiconductor channel to detect the memory state of the transistor-based data storage circuit; and
applying an erasing bias to purge carriers from the storage pocket structure.

20. The method of claim 19, wherein applying a front bias to the gate and applying back bias to the back gate to store carriers in the storage pocket structure and set the memory state of the transistor-based data storage circuit includes applying the respective front and back biases to store carriers in a bending structure of the storage pocket structure by using space charge effects to effect a local change in electron energy at a semiconductor junction in the storage pocket structure.

21. The method of claim 19, wherein
the storage pocket structure includes a semiconductor structure having a quantum well-type band bending alignment, and
applying a front bias to the gate and applying back bias to the back gate to store carriers in the storage pocket structure and set the memory state of the transistor-based data storage circuit includes applying the respective biases to control the spatial hole distribution in the semiconductor structure, via the band bending alignment, to store the carriers.

22. The method of claim 19, wherein applying an erasing bias includes applying an erasing bias to the back gate to purge carriers from the storage pocket structure, the erasing bias being opposite in sign, relative to the back bias.

* * * * *